United States Patent
Chen et al.

(10) Patent No.: US 9,995,790 B2
(45) Date of Patent: *Jun. 12, 2018

(54) CUSTOMIZABLE CONTACTOR PROGNOSTICS SYSTEM

(75) Inventors: Chao Chen, Shanghai (CN); Qing Jia, Shanghai (CN); Angelo R. Bortolus, Mississauga (CA); F. Michael Frayne, Waterloo (CA); Jeffrey David Gandier, Ayr (CA); Xiang Jing, Shanghai (CN)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 13/355,706

(22) Filed: Jan. 23, 2012

(65) Prior Publication Data

US 2012/0123698 A1 May 17, 2012

Related U.S. Application Data

(63) Continuation of application No. 12/336,023, filed on Dec. 16, 2008.

(51) Int. Cl.
*G01B 3/44* (2006.01)
*G01R 31/327* (2006.01)

(52) U.S. Cl.
CPC ................. *G01R 31/3277* (2013.01)

(58) Field of Classification Search
CPC .................................... G07C 3/00; G07C 3/10
USPC .......................................................... 702/34
See application file for complete search history.

(56) References Cited

U.S. PATENT DOCUMENTS

| | | | |
|---|---|---|---|
| 5,754,387 A * | 5/1998 | Tennies ................ | H01H 47/002 361/170 |
| 6,958,671 B2 * | 10/2005 | Chen et al. ..................... | 335/80 |
| 7,705,601 B2 * | 4/2010 | Zhou et al. ................... | 324/424 |
| 2010/0057237 A1 * | 3/2010 | Kettaneh et al. ............. | 700/103 |

* cited by examiner

*Primary Examiner* — Toan Le
*Assistant Examiner* — Xiuquin Sun
(74) *Attorney, Agent, or Firm* — Quarles & Brady LLP

(57) ABSTRACT

A method and apparatus for identifying a health status of a contactor includes a processor coupled to a computer readable media. The processor is coupled to the contactor to instruct the contactor to open and close. A database stored in the computer readable media includes operation count variables for the contactor, closing time variables for the contactor, and health status rules for the contactor. The operation count variables and the closing time variables may be inputs to the health status rules to identify the health status of the contactor. A customization program may also be stored in the computer readable media. The customization program enables an operator to modify at least one of the operation count variables, the closing time variables, and the health status rules to affect the identified health status of the contactor.

19 Claims, 13 Drawing Sheets

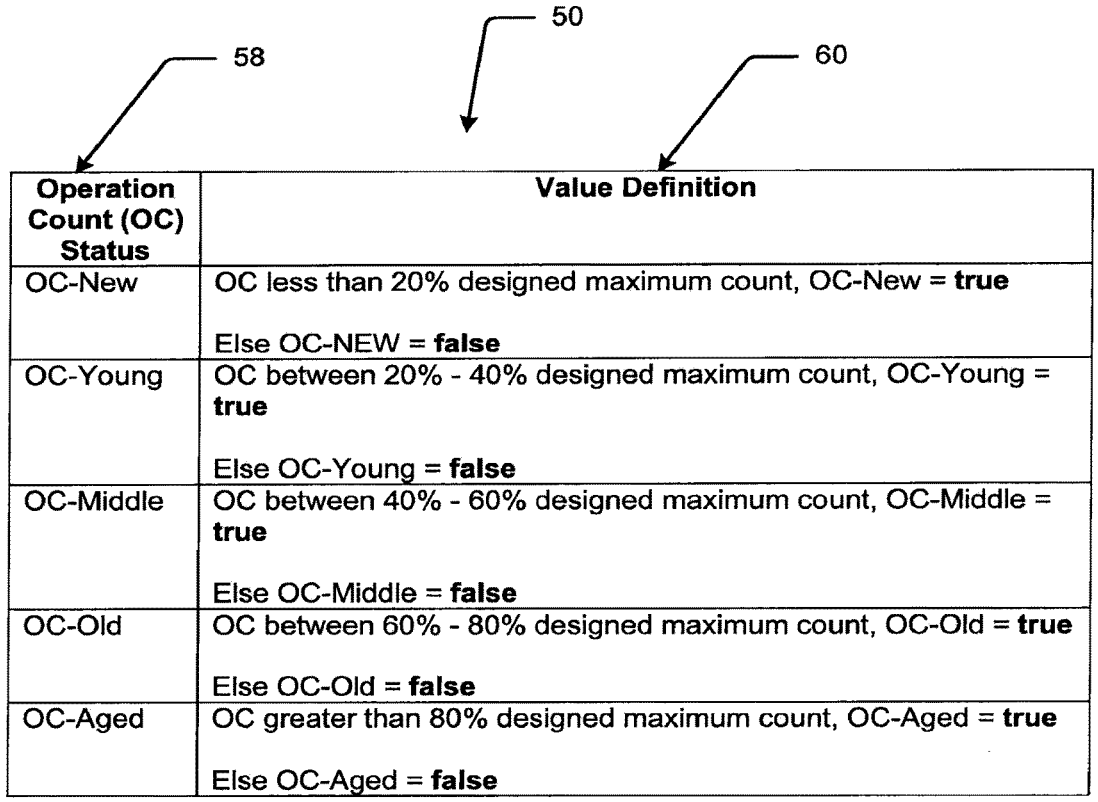

| Operation Count (OC) Status | Value Definition |
|---|---|
| OC-New | OC less than 20% designed maximum count, OC-New = true<br><br>Else OC-NEW = false |
| OC-Young | OC between 20% - 40% designed maximum count, OC-Young = true<br><br>Else OC-Young = false |
| OC-Middle | OC between 40% - 60% designed maximum count, OC-Middle = true<br><br>Else OC-Middle = false |
| OC-Old | OC between 60% - 80% designed maximum count, OC-Old = true<br><br>Else OC-Old = false |
| OC-Aged | OC greater than 80% designed maximum count, OC-Aged = true<br><br>Else OC-Aged = false |

Fig. 3

CUSTOMIZABLE CONTACTOR PROGNOSTICS SYSTEM

CROSS-REFERENCE TO RELATED APPLICATIONS

This application is a continuation application of U.S. patent application Ser. No. 12/336,023, filed Dec. 16, 2008, now patented as U.S. Patent No. 8,103,460, and entitled "Customizable Contactor Prognostics System," which is incorporated herein by reference.

STATEMENT REGARDING FEDERALLY SPONSORED RESEARCH OR DEVELOPMENT

Not applicable.

BACKGROUND OF THE INVENTION

The present invention relates to contactor health and more specifically to a system and method that can be customized by a user for predicting the health of contactors and the remaining life of contactors.

Contactors are generally used in motor starter applications to switch on/off a load as well as to protect a load, such as a motor, or other electrical devices, from current overloading. As such, a typical contactor has one or more contact assemblies—a contact assembly for each phase or pole required for the electrical device. Each contact assembly, in turn, includes a pair of stationary contacts and a pair of moveable contacts. One stationary contact will be a line side contact and the other stationary contact will be a load side contact. The moveable contacts are controlled by an actuating assembly comprising a contact carrier and an armature magnet assembly which is energized by a coil to move the moveable contacts to form a bridge between the stationary contacts. When the moveable contacts are engaged with both stationary contacts, current is allowed to travel from the power source or line to the load or electrical device. When the moveable contact is separated from the stationary contacts, an open circuit is created and the line and load are electrically isolated from one another. Other contact assemblies have different configurations, including one stationary contact and one movable contact, for example.

Since contactors and motor starters are important components of both automation and control systems, monitoring their remaining useable life, or "health", to predict impending faults before occurrence is essential. Un-predicted failures of contactors not only cause costly work stoppages, but also can cause damage to a load and other related systems and equipment. In contrast, over-cautious approaches to contactor monitoring and replacement increase maintenance costs and slow or delay usage of the motor/load.

Currently, most methods for estimating the working life of contactors rely upon the manufacturer's life test data or guidelines. That is, most commercially available contactors have a designated number of operations or cycles (e.g., 100,000 to 2,500,000 operations) after which the manufacturer recommends replacement to avoid failure in use. Thus, many systems and methods for predicting failure simply count the number of operations that a contactor completes. However, each contactor will not necessarily operate for the same number of cycles before failure. Exacerbating matters, the causes of failures vary among contactors as well as the conditions which lead to possible failure issues. How a contactor is operated, the conditions under which a contactor is used, and the characteristics of the environment in which a contactor is used cause even more variation in the number of operations a contactor might undergo before failure. Therefore, to be useful, counting methods must be overly cautious in setting replacement schedules, or risk contactor failures while in use. In addition, some types of loads, or one time events such as faults, can drastically change the expected life of a contactor which reinforces the usefulness of a real time monitoring system such as the one proposed in this "User Customizable Contactor Prognostics System."

In addition, different applications have different consequences when contactors fail. For this reason, the conditions under which contactors should be replaced may vary between applications. For example, in the case of an auto manufacturer, a failed contactor may result in severe and expensive damage to manufacturing robots while a failed contactor in a transfer line associated with a machine vision system may simply mean that a part is not imaged properly and no physical damage may result. Here, the auto manufacturer would likely have a lower tolerance for contactor failure than the manufacturer employing the machine vision system.

Thus, it would be desirable to have a system and method capable of estimating the remaining useable life of a contactor and impending faults thereof. It would also be advantageous if the system and method were customizable by a user to accommodate different application requirements and user preferences.

BRIEF SUMMARY OF THE INVENTION

It has been recognized that a contactor prognostics method and apparatus can be provided that is more accurate than previous methods and apparatuses where the method accounts for both operation count and closing time of a contactor when assessing health status. It has also been recognized that methods and apparatus can be provided that are customizable by system operators to suit particular applications and user/operator preferences. To this end, in at least some embodiments an operator may be able to define different combinations of contactor operating count and closing time durations to be associated with different contactor health statuses. In some embodiments an operator may be able to define different operation count variables and/or closing time variables and their relative definitions where those variables are then used together to assess health status.

Consistent with the above comments, at least some embodiments include a method for identifying the health status of a contactor, the method comprising the steps of counting the number of operations performed by the contactor, identifying a closing time of the contactor, using the number of operations and the closing time to assess the health status of the contactor and where the health of the contactor is a first health status, reporting the health status of the contactor. In some cases the step of identifying a closing time of the contactor includes identifying a most current closing time of the contactor.

In some cases the step of using the number of operations and the closing time to assess health status includes setting an operation count variable to one of a plurality of different operation count variables as a function of the number of times the contactor has been operated and setting a closing time variable to one of a plurality of different closing time variables as a function of the identified closing time and using the operation count variable and the closing time variable to assess the health status. In some cases the contactor has a maximum contactor count value and is characterized by a maximum contactor closing time value and wherein the step of setting an operation count variable includes setting the operation count variable as a function of the percent of the maximum contactor count value represented by the current number of operations performed and the step of setting a closing time variable includes setting the closing time variable as a function of the percent of the maximum contactor closing time value represented by the most recent closing time of the contactor.

In some cases the step of setting the operation count variable includes setting the operation count variable to New, Young, Middle, Old and Aged when the current number of operations is between substantially zero and substantially 20%, substantially twenty and substantially 40%, substantially forty and substantially 60%, substantially sixty and substantially 80% and substantially eighty and substantially 100% of the designed life operations value, respectively, and, wherein, the step of setting a closing time variable includes setting the closing time variable to Good, Normal and Bad when the most recent closing time is less than substantially 80% of the maximum designed closing time, between substantially 80 and substantially 110% of the maximum designed closing time and greater than substantially 110% of the maximum designed closing time, respectively, and wherein the step of using the number of operations and the closing time to assess health status includes applying health status rules to the operation count variable and the closing time variable to assess health status of the contactor. In some cases the step of using the number of operations and the closing time to assess the health status of the contactor includes applying a set of health status rules to the number of operations and the closing time to determine the health status, the method further including the step of enabling a system operator to modify the set of health status rules.

In some cases the step of enabling a system operator to modify the set of health status rules includes providing an interface for the operator to use to modify the health status rules. In some cases the step of enabling an operator to modify the set of health status rules includes enabling the operator to identify different combinations of the operation count variables and the closing time variables that comprise the first health status. In some cases all health statuses are indicated.

In some embodiments the method further includes the steps of enabling an operator to modify definitions of at least one of the operating count variables and the closing time variables for subsequent use.

Other embodiments include an apparatus for identifying the health status of a contactor, the apparatus comprising a processor programmed to perform the steps of counting the number of operations performed by the contactor, identifying a closing time of the contactor, using the number of operations and the closing time to assess the health status of the contactor and where the health of the contactor is a first health status, reporting the health status of the contactor.

In some cases the step of identifying a closing time of the contactor includes identifying a most current closing time of the contactor. In some cases the processor performs the step of using the number of operations and the closing time to assess health status by setting an operation count variable to one of a plurality of different operation count variables as a function of the number of times the contactor has been operated and setting a closing time variable to one of a plurality of different closing time variables as a function of the identified closing time and using the operation count variable and the closing time variable to assess the health status. In some cases the contactor has a maximum contactor count value designed life operations value and is characterized by a maximum contactor closing time value and wherein the processor performs the step of setting an operation count variable by setting the operation count variable as a function of the percent of the maximum contactor count value represented by the current number of operations performed and the step of setting a closing time variable by setting the closing time variable as a function of the percent of the maximum contactor closing time value represented by the most recent closing time of the contactor.

In some cases the processor performs the step of setting the operation count variable by setting the operation count variable to New, Young, Middle, Old and Aged when the current number of operations is between substantially zero and substantially 20%, substantially twenty and substantially 40%, substantially forty and substantially 60%, substantially sixty and substantially 80% and substantially eighty and substantially 100% of the designed life operations value, respectively, and, performs the step of setting a closing time variable by setting the closing time variable to Good, Normal and Bad when the most recent closing time is less than substantially 80% of the maximum designed closing time, between substantially 80 and substantially 110% of the maximum designed closing time and greater than substantially 110% of the maximum designed closing time, respectively, and wherein the processor performs the step of using the number of operations and the closing time to assess health status by applying health status rules to the operation count variable and the closing time variable to assess health status of the contactor.

In some cases the processor performs the step of using the number of operations and the closing time to assess the health status of the contactor by applying a set of health status rules to the number of operations and the closing time to determine the health status, the processor further programmed to perform the step of enabling a system operator to modify the set of health status rules. In some cases the processor performs the step of enabling a system operator to modify the set of health status rules by providing an interface for the operator to use to modify the health status rules.

In some cases the processor performs the step of enabling an operator to modify the set of health status rules by enabling the operator to identify different combinations of the operation count variables and the closing time variables that comprise the first health status. In some cases all health statuses are indicated.

In some embodiments the processor is further programmed to perform the steps of enabling an operator to modify definitions of at least one of the operating count variables and the closing time variables for subsequent use.

Other embodiments include a method for determining a contactor life left value for a contactor, the method comprising the steps of specifying a maximum contactor operations count for the contactor, counting the number of contactor operations for the contactor, identifying the average number of contactor operations per unit of time for the contactor and mathematically combining the average number of operations per unit of time with the number of contactor operations and the maximum contactor operations count to identify the contactor life left value.

In some cases the step of identifying the average number of contactor operations per unit time includes counting the number of days that the contactor is operated and dividing the number of contactor operations by the number of days that the contactor is operated. In some cases the step of mathematically combining includes dividing the difference between the maximum contactor count value and the number of contactor operations by the average number of contactor operations per unit of time for the contactor.

Other embodiments include a method and apparatus for identifying a health status of a contactor. The method and apparatus includes a processor coupled to a computer readable media. The processor is coupled to the contactor to instruct the contactor to open and close. A database stored in the computer readable media includes operation count variables for the contactor, closing time variables for the contactor, and health status rules for the contactor. The operation count variables and the closing time variables may be inputs to the health status rules to identify the health status of the contactor. A customization program may also be stored in the computer readable media. The customization program enables an operator to modify at least one of the operation count variables, the closing time variables, and the health status rules to affect the identified health status of the contactor.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE SEVERAL VIEWS OF THE DRAWINGS

FIG. 3 is a table illustrating an exemplary operation count variable definition database that may be included in the rules database of FIG. 2;

Figure 1:
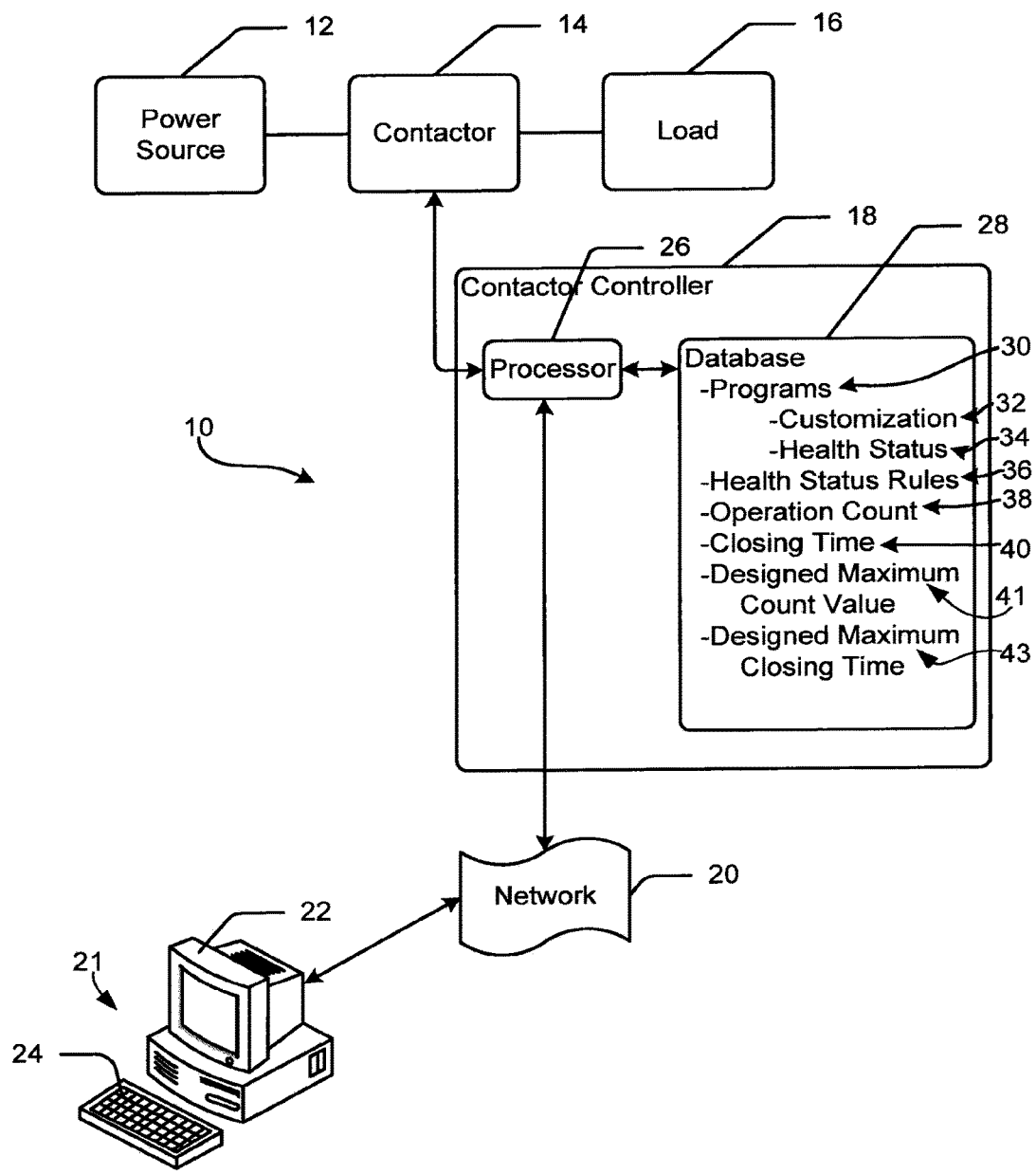
FIG. 1 is a schematic illustrating a system including a customizable contactor prognostics subsystem that is consistent with at least some aspects of the present disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

The various aspects of the subject invention are now described with reference to the annexed drawings, wherein like reference numerals correspond to similar elements throughout the several views. It should be understood, however, that the drawings and detailed description hereafter relating thereto are not intended to limit the claimed subject matter to the particular form disclosed. Rather, the intention is to cover all modifications, equivalents, and alternatives falling within the spirit and scope of the claimed subject matter.

As used herein, the terms "component," "system" and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a computer and the computer can be a component. One or more components may reside within a process and/or thread of execution and a component may be localized on one computer and/or distributed between two or more computers or processors.

The word "exemplary" is used herein to mean serving as an example, instance, or illustration. Any aspect or design described herein as "exemplary" is not necessarily to be construed as preferred or advantageous over other aspects or designs.

Furthermore, the disclosed subject matter may be implemented as a system, method, apparatus, or article of manufacture using standard programming and/or engineering techniques to produce software, firmware, hardware, or any combination thereof to control a computer or processor based device to implement aspects detailed herein. The term "article of manufacture" (or alternatively, "computer program product") as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Referring specifically to FIG. 1, the present invention will be described in the context of an exemplary system 10 including a power source 12, a contactor 14, a load 16, a contactor controller 18, a network 20 and a computer or workstation 21. Power source 12 provides power to load 16 (e.g., a motor) via contactor 14 where the contactor 14 can be opened and closed to provide power to and cut power off from load 16. Here, contactor 14 may be a medium voltage contactor such as the 400 Amp 1502 Vacuum Contactor manufactured by Allen-Bradley that is suitable for all types of AC loads such as, for instance, motors, transformers, power capacitors and resistive heating loads. These contactors are used in various starter and drive configurations such as, for instance, full voltage non-reversing, full voltage reversing, two speed, reduced voltage, synchronous, drive input/output and bypass applications. The 1502 Vacuum Contactors are designed for use with the IntelliVac™ control module manufactured by Allen-Bradley.

Referring still to FIG. 1, contactor controller 18 controls opening and closing operations of contactor 14. To this end, controller 18 may include one of the control modules, such as those manufactured by Allen-Bradley. Controller 18 includes a processor 26 and a database 28. Processor 26 is linked to contactor 14 for opening and closing the contactor during contactor operations. Processor 26 is also linked to database 28 to access programs and data stored therein and to store and update data therein.

Database 28 includes, among other things, programs 30, health status rules 36, an operation count value 38, a closing time value 40, a maximum contactor count and a maximum contactor closing time. The programs 30 include a health status program 34 that processor 26 runs to assess the health status of contactor 14 during operation. While performing health status program 34, processor 26 applies the health status rules 36 to assess contactor health status. In at least some embodiments when contactor health status has deteriorated sufficiently, processor 26 provides notice or an indication that contactor 14 should be replaced or at least maintained.

In at least some embodiments, processor 26 provides notice by transmitting a signal via network 20 (e.g., via the Ethernet, the Internet, etc.) to computer terminal 21 which can present a contactor maintenance or replacement warning or report to a system operator. To this end, computer 21 includes a display screen 22 and a keyboard 24 or other input device (not illustrated). Maintenance or replacement notices may be presented via text on display 22. In some embodiments, processor 26 may simply set a warning flag (i.e., change the flag from an off value to an on value) to indicate a warning condition and some other program may recognize the set bit as a warning indicator and provide a notice message to the operator via computer 21. In still other embodiments, where a contactor warning signal is generated, the system associated with contactor 14 may be fully or partially shut down.

Referring still to FIG. 1, the health status rules 36 may include several different types of rules. In at least some embodiments, the health status rules 36 will take into account operating characteristics of contactor 14 when determining the health status of the contactor where the operating characteristics include an operation count value and a closing time value. Here, the phrase "operation count", as the label implies, is simply a count value indicating the number of times contactor 14 has been closed and reopened. Contactors are designed to achieve or reach, in general, a maximum contactor count (MCC) where, after the maximum count has occurred, likelihood of failure substantially increases. Thus, as the operation count 38 increases and approaches the designed maximum contactor count, likelihood of contactor failure increases.

The phrase "closing time" refers to the amount of time required for the contactor 14 to change from an open state to a closed state after a close command has been provided to the contactor 14 by processor 26. Contactors are manufactured and designed to have a maximum contactor closing time where, as the closing time approaches and exceeds the maximum closing time, the likelihood of failure increases. Thus, as the duration of the contactor closing time approaches and then exceeds the maximum contactor closing time, the duration can be used as an indicator of the likelihood of contactor failure. In FIG. 1, both the maximum contactor count 41 and the maximum contactor closing time 43 are stored in database 28.

Figure 2:
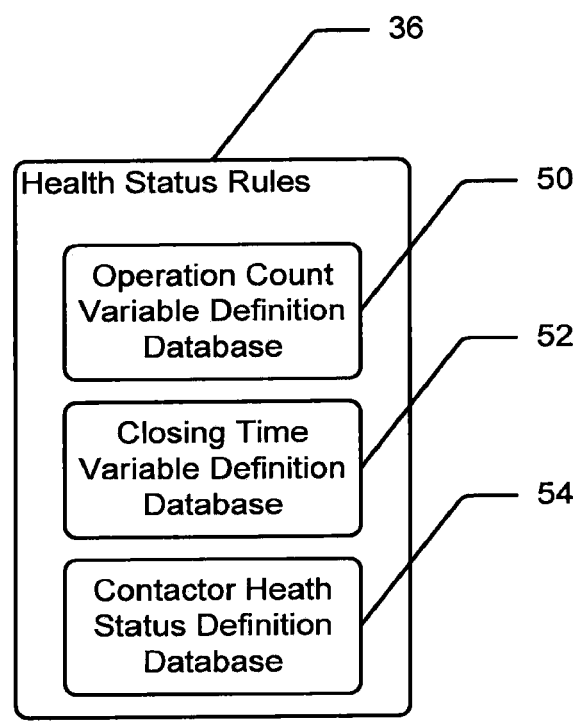
FIG. 2 is a schematic illustrating an exemplary health status rules database that may be included in the FIG. 1 system.

Referring now to FIG. 2, an exemplary health status rules database 36 is illustrated that includes three separate sub-databases including an operation count variable value definition database 50, a closing time variable value definition database 52 and a contactor health status variable value definition database 54. Referring to FIG. 3, an exemplary operation count variable value definition database 50 is illustrated in table format. Here, it should be appreciated that while database 50 is shown in table format to simplify this explanation, database 50 may be stored in other formats know in the art. Database 50 includes an operation count (OC) variable column 58 and a value definition column 60. The operation count variable column 58 includes an exemplary list of operation count variables including OC-New, OC-Young, OC-Middle, OC-Old and OC-Aged where the New, Young, Middle, Old and Aged qualifiers indicate relative operation count. Thus, variable OC-New indicates that an associated contactor is relatively new while variable OC-Aged indicates that an associated contactor is relatively old and is at or is likely approaching the end of its useful life.

Value definition column 60 provides a separate definition for each of the operation count variables in column 58 and indicates how a separate flag associated with each one of the variables in column 58 should be set as a function of an instantaneous operation count. Thus, for example, the value definition for the operation count variable OC-New indicates that where the operation count is less than 20% of the designed maximum contactor count, the OC-New variable should be equal to true and, under all other circumstances, the OC-New variable should be equal to false. Similarly, column 60 indicates that when the operation count is between twenty and 40% of the maximum contactor count, is between 40 and 60% of the maximum contactor count, is between 60 and 80% of the designed maximum contactor count and is greater than 80% of the designed maximum contactor count, the OC-Young, OC-Middle, OC-Old and OC-Aged variables should be set equal to true, respectively, and under all other circumstances, those variables should be set equal to false. Thus, at any time during the life of a contactor 14, only one of the operation count variables OC-New, OC-Young, OC-Middle, OC-Old and OC-Aged will be set equal to true and the other variables will be set equal to false.

Figure 4:
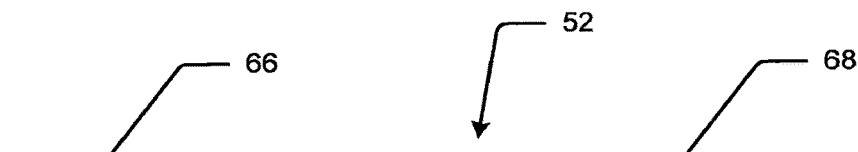
FIG. 4 is a table illustrating an exemplary closing time variable definition database that may be included in the rules database of FIG. 2.

Referring now to FIG. 4, an exemplary closing time variable value definition database 52 is illustrated. Here, again, database 52 is shown in table format to simplify this explanation and it should be recognized that database 52 may take any other known database form. Database 52 includes a closing time (CT) variable column 66 and a value definition column 68. Closing time variable column 66 includes three different closing time variables including a CT-Good status, a CT-Normal and a CT-Bad status. Here the qualifiers Good, Normal and Bad indicate relative closing time durations. Column 68 provides a value definition for each one of the variables in column 66. For example, column 68 indicates that when the closing time is less than 80% of the maximum contactor closing time for contactor 14, the CT-Good variable should be set equal to true and at all other times the CT-Good variable should be set equal to false. Similarly, column 68 indicates that when the closing time contactor 14 is between 80% and 110% of the maximum designed closing time for the contactor, the CT-Normal variable should be set equal to true and at all other times the CT-Normal variable should be set equal to false and indicates that when the closing time is greater than 110% of the maximum design closing time the CT-Bad variable should be set equal to true and at all other times the CT-Bad variable should be set equal to false.

Figure 5:
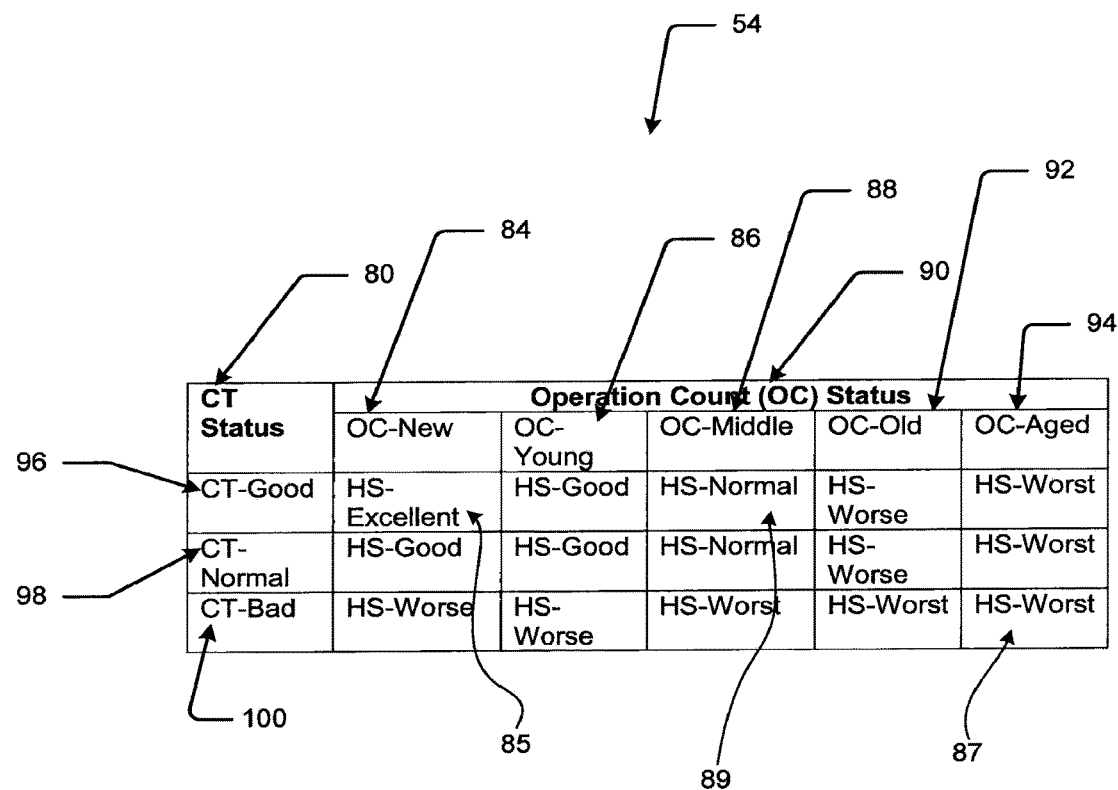
FIG. 5 is a schematic illustrating an exemplary contactor health status definition database that may be included in the rules database of FIG. 2.

Referring now to FIG. 5, an exemplary contactor health status variable value definition database 54 is illustrated. Once again, database 54 is shown in table format to simplify this explanation and it should be realized that the database 54 may be provided in any of several other different forms known in the art. Database 54 includes two columns including a closing time variable column 80 and an operation count variable column 90. The closing time variable column 80 includes each of the three closing time variables described above with respect to FIG. 4 including the CT-Good variable 96, the CT-Normal variable 98 and the CT-Bad variable 100. Operation count variable column 90 includes five separate sub-columns corresponding to the five separate operation count variables described above with respect to FIG. 3. Thus, the sub-columns include an OC-New sub-column 84, an OC-Young sub-column 86, an OC-Middle sub-column 88, an OC-Old sub-column 92 and an OC-Aged sub-column 94. The table 54 includes a separate field corresponding to each combination of a closing time variable and an operation count variable and indicates a relative health status for an associated contactor 14. Thus, for example, field 85 corresponds to the CT-Good variable 96 and the OC-New variable 84 and indicates that when the associated closing time and count variables occur, the health status of the contactor 14 is excellent. Thus, referring to FIGS. 3, 4 and 5, field 85 indicates that when the operation count is less than 20% of the maximum contactor count (see FIG. 3) and the most recent closing time is less than 80% of the maximum contactor closing time (see FIG. 4), the contactor health status will be excellent (see FIG. 5). As another example, field 87 corresponds to the CT-Bad variable 100 and the OC-Aged variable 94 and indicates that when those two variables occur, the health status of the contactor associated therewith is particularly bad (i.e., the indicator in field 87 indicates HS-Worst). As yet one other example, field 89 indicates that the health status of an associated contactor is normal when the closing time variable is CT-Good and the operation count variable is OC-Middle.

In the illustrated example the health statuses include Excellent, Good, Normal, Worse and Worst indicating relative contactor health status. Exemplary definitions of the health status variables are shown in Table 1 below.

TABLE 1

| Health Status (HS Variables) | Value Definitions |
|---|---|
| HS—Excellent | New contactor is functioning normally. |
| HS—Good | Contactor has possibly been run for certain time, but still functioning normally. |
| HS—Normal | Contactor is possibly over half its life span, but still functioning normally. |
| HS—Worse | Contactor is possibly close to the malfunction stage and needs special maintenance or repair operations. In some embodiments a warning flag will be set to indicate this state. |
| HS—Worst | Contactor is likely close to malfunction stage and needs special maintenance, repair or replacement operations. In some embodiments a fault sign will be set to indicate this state. |

Figure 6:
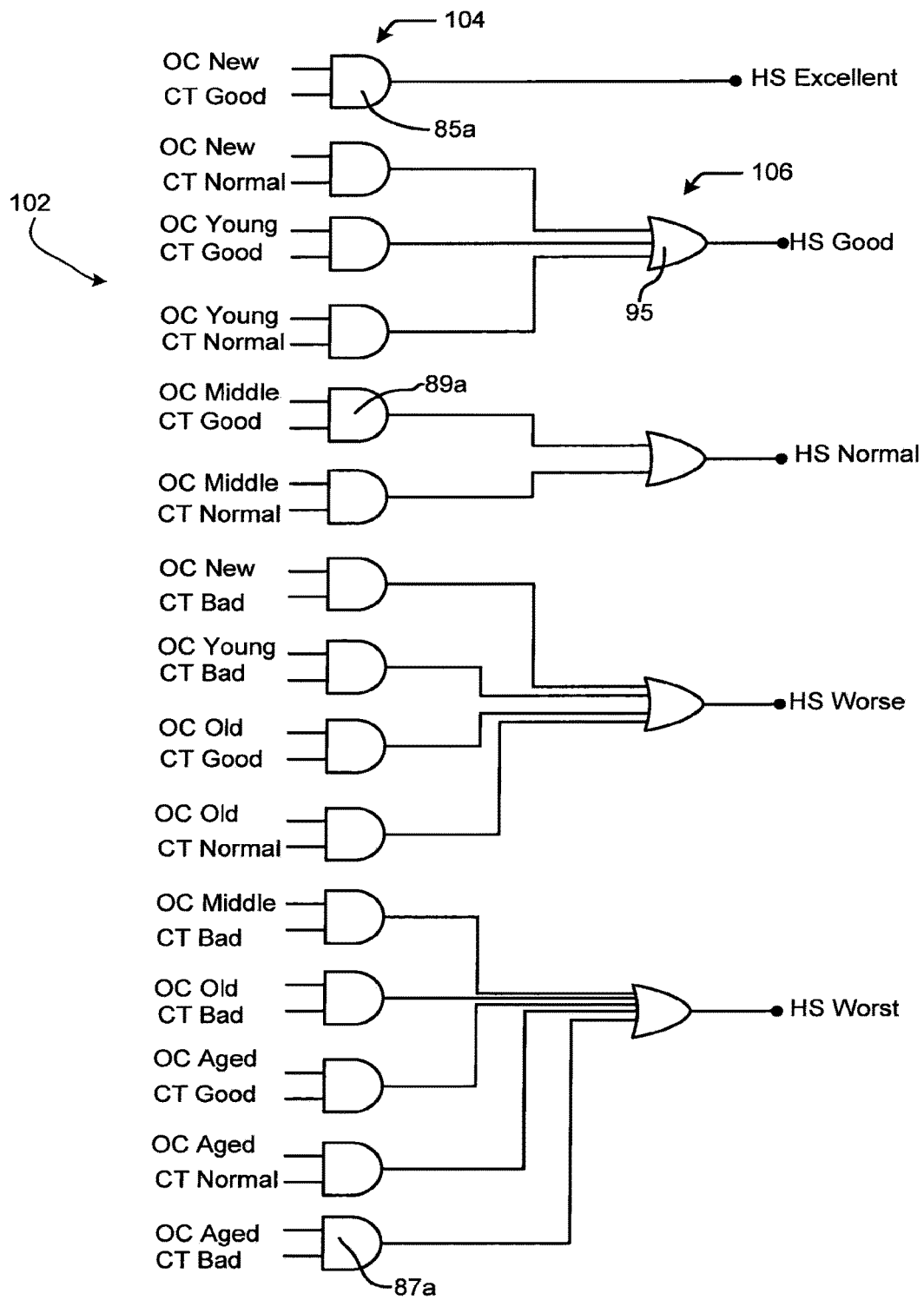
FIG. 6 is a schematic illustrating exemplary digital logic that is consistent with the health status information shown in FIG. 5.

Referring still to FIG. 5 and now also to FIG. 6, an exemplary digital logic representation 102 of the information presented in FIG. 5 is shown in FIG. 6 where a plurality of AND gates 104 and OR gates 106 represent the FIG. 5 information. To this end, representation 102 includes 15 AND gates collectively identified by numeral 104 where each of the AND gates represents a different one of the closing time variable and operation count variable combinations shown in FIG. 5. Thus, for instance, AND gate 85a corresponds to field 85 in database 54 where the variable inputs are OC-New and CT-Good and the logic output indicates that the contactor health status is excellent. Similarly, AND gates 87a and 89a correspond to fields 87 and 89 in FIG. 5. The OR gates 106 each simply "OR" together the outputs of all of the AND gates corresponding to an associated health status of the contactor. For example, OR gate 95 "ORs" together the outputs of all three AND gates associated with the good contactor health status.

Figure 7:
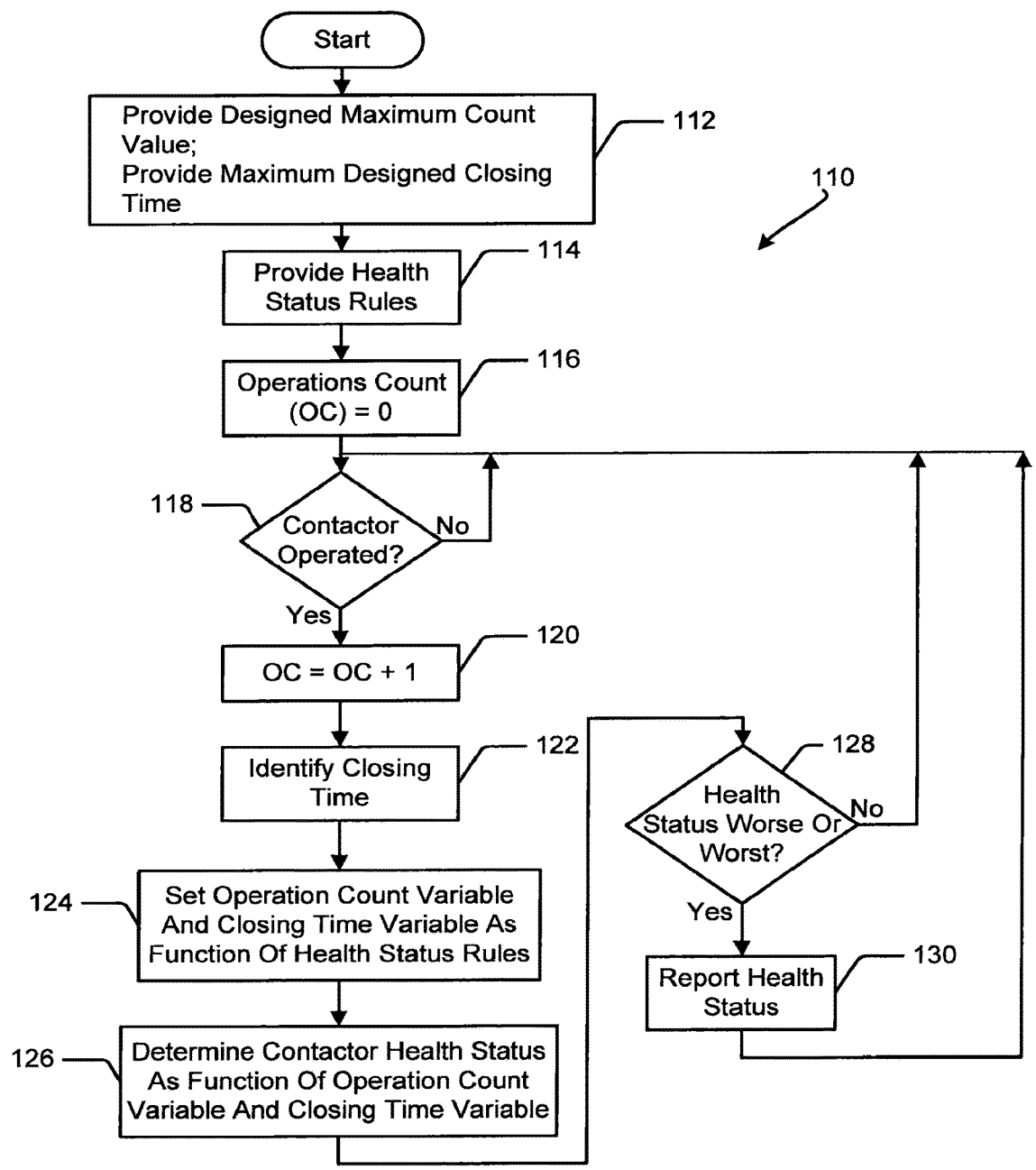
FIG. 7 is a schematic illustrating a flow chart of a method consistent with at least some embodiments of the present disclosure.

Referring once again to FIG. 1 and also to FIG. 7, an exemplary process 110 that is consistent with the system described above and that may be performed by processor 26 is illustrated in FIG. 7. At block 112, a maximum contactor count MCC value and a maximum contactor closing time MCCT value are provided to processor 26 which stores those values in database 28 (see 41 and 43 in FIG. 1). At block 114, health status rules 36 are provided to processor 26 which stores those rules in database 28. At block 116, an operation counter or count (OC) is set equal to zero prior to the initial time a contactor to be monitored is operated.

Referring still to FIGS. 1 and 7, at decision block 118, during normal operation of system 10 wherein contactor 14 may be operated, processor 26 determines whether or not contactor 14 is operated. Once contactor 14 is operated, control passes to process block 120 where the operation count (OC) is incremented by one and then to block 122 where the closing time for the contactor 14 is identified and stored in database 28 (see 40 in FIG. 1). Continuing, at block 124, processor 26 applies the health status rules 36 to set the operation count variable and the closing time variable. To this end, in the present example, processor 26 applies the definitions from databases 50 and 52 as shown in FIGS. 3 and 4, respectively, to set the operation count variable and closing time variable (i.e., to set one of the closing time variables and one of the operation count variables equal to one while all other variables remain zero).

At block 126, processor 26 applies the health status rules 36 to the operation count and closing time variables to determine a contactor health status. In the present example, processor 26 applies the rules specified in FIG. 5 to assess contactor health status. At block 128, in at least some embodiments, where the health status of the contactor 14 is "worse" or "worst" as specified by database 54 in FIG. 5, control passes to block 130 where the "worse" or "worst" health status is reported or indicated (e.g., via display 22). After block 130, control passes back up to block 118 where the process described above continues. Referring again to block 128, where the health status is not "worse" or "worst", in the illustrated example, control passes from block 128 back up to block 118 where the process described above continues.

In at least some embodiments, consistent with the description above, operation count variable definitions and closing time variable definitions as well as the health status definitions may be pre-defined by a contactor manufacturer and a system operator may not be able to modify those definitions. In other embodiments it is contemplated that system 10 (see again FIG. 1) may enable a system operator to modify operation count variable, closing time variable and health status definitions or at least subsets thereof to accommodate specific applications or operator preferences. Thus, for example, referring again to FIG. 5, in at least some embodiments a system operator may want to change the health status corresponding to field 89 to be "worse" instead of "normal". As another example, referring to FIG. 3, an operator may want to change the percentages in the value definition column 60 corresponding to one or more of the operation count variables in column 58. For instance, the operator may want to entirely eliminate the OC-Young count variable and have the OC-New variable correspond to all operation counts that are less than 40% of the maximum contactor count. Many other health status rule modifications are contemplated.

Figure 8:
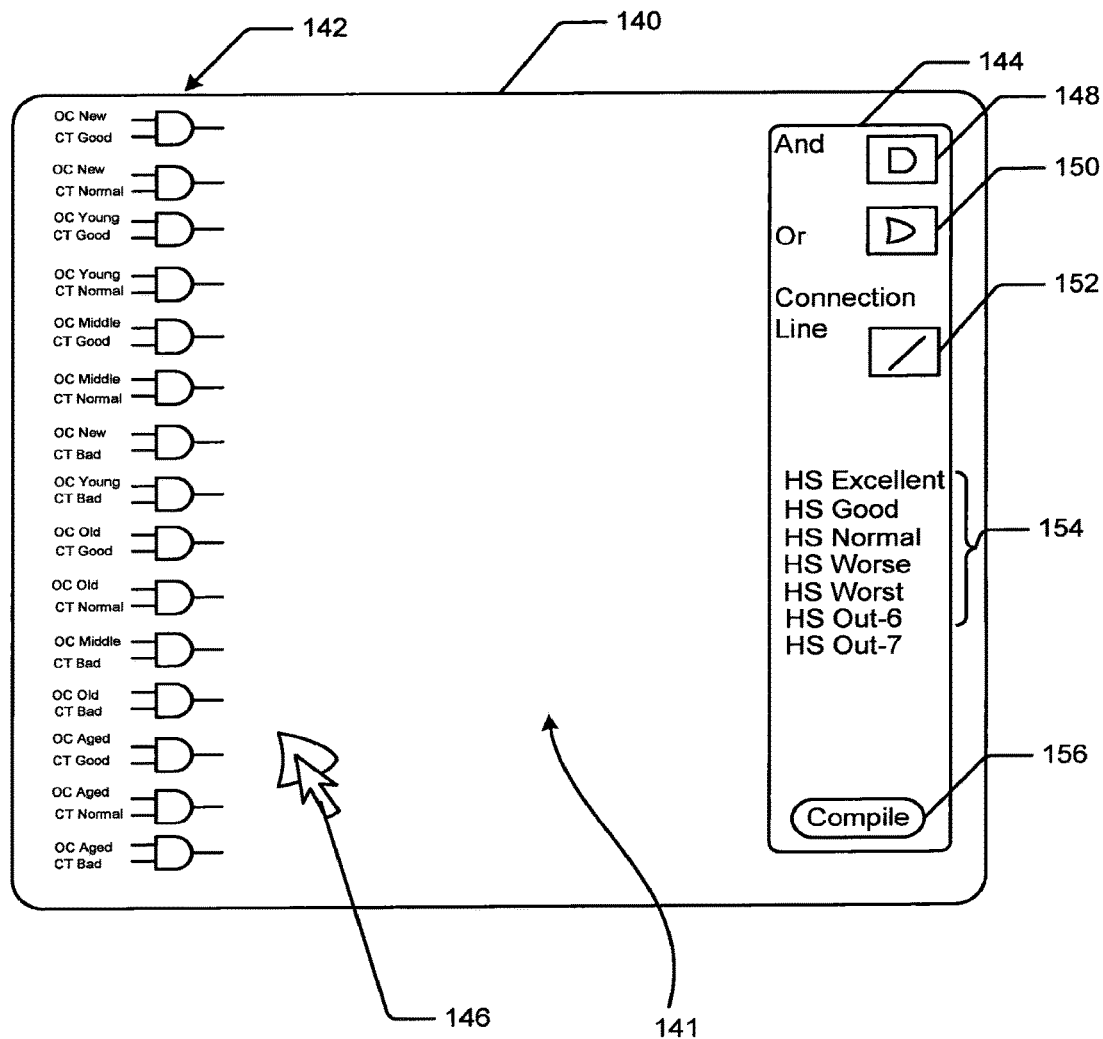
FIG. 8 is a schematic illustrating an exemplary screen shot that may be presented via the display shown in FIG. 1 when a processor performs a customization program whereby a system operator can specify or modify health status rules according to at least some aspects of the present disclosure.

Referring once again to FIG. 1, in at least some embodiments, to enable an operator to modify health status rules to be applied by processor 26, the database programs 30 may include a customization program 32. While various types of customization programs 32 are contemplated by this disclosure, one particularly useful customization program will be described in some detail. To this end, also referring to FIG. 8, an exemplary customization program screen shot 140 is illustrated. Here, screen shot 140 includes a logic specifying workspace 141 and a tool bar 144. In at least some embodiments it is contemplated that where operation count variables and closing time variables are predefined, a separate AND gate 142 corresponding to each one of the operation count variable and closing time variable combinations may be provided. In FIG. 8, the AND gates 142 include 15 separate AND gates corresponding to each one of the combinations shown in FIG. 5.

Referring still to FIG. 8, tool bar 144 includes an AND icon 148, an OR icon 150, a connector line icon 152, health status indicators collectively identified by numeral 154 and a compile icon 156. Here, AND icon 148 can be selected via a mouse controlled cursor 146 or the like to cause an instance of an AND gate to appear in workspace 141. Once a gate is placed within workspace 141, the cursor 146 can be used to select the gate and move the gate around within workspace 141 to a desired location.

Figure 9:
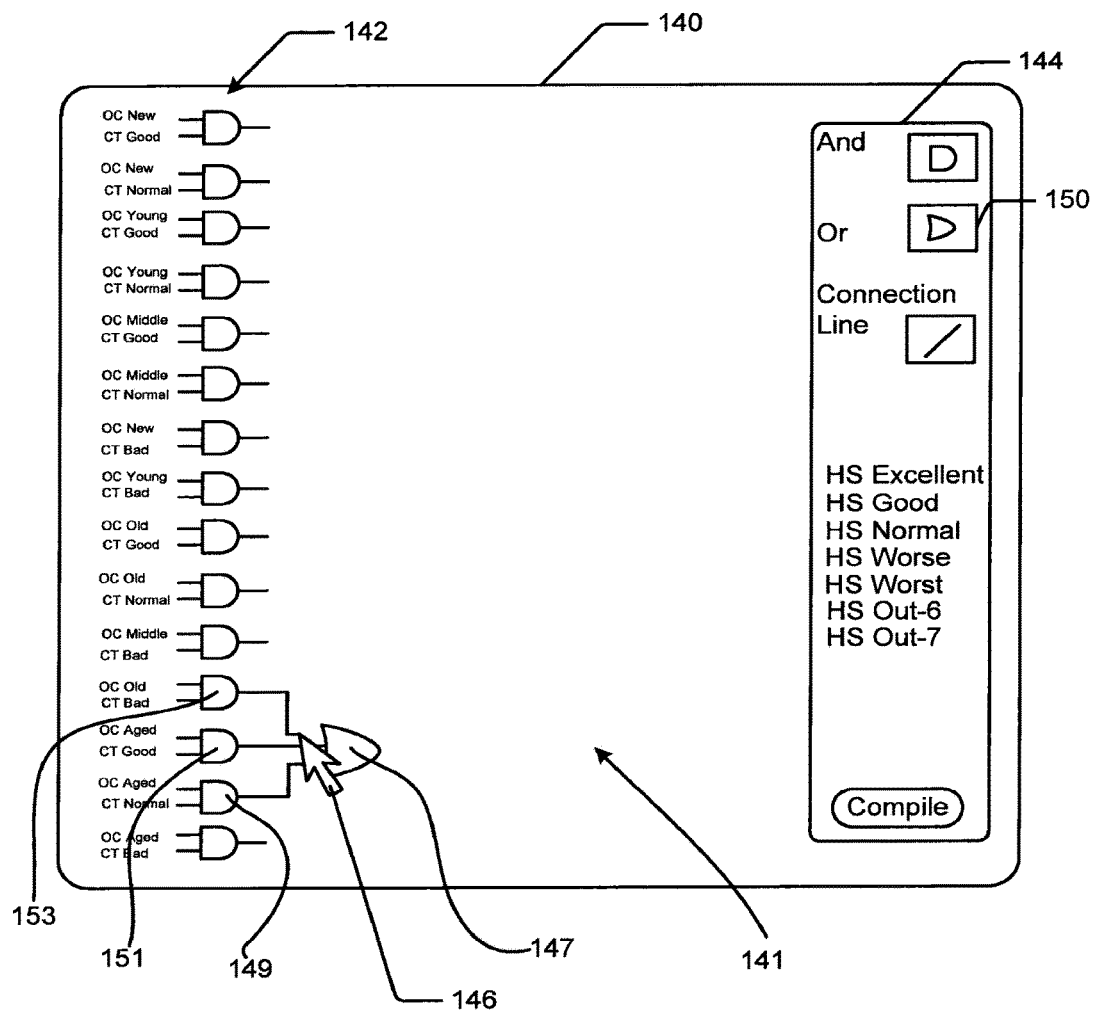
FIG. 9 is similar to FIG. 8, albeit illustrating the screen shot at a different time during a customization process.
Figure 10:
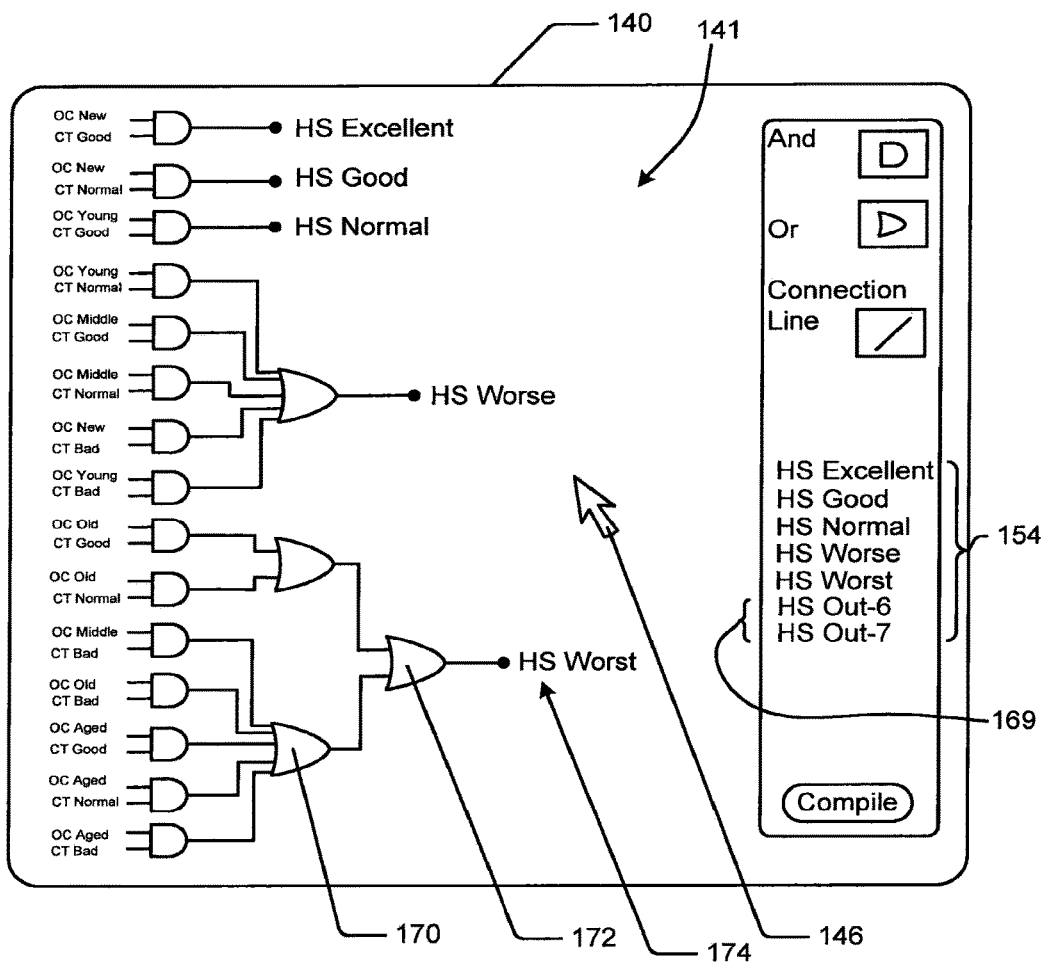
FIG. 10 is similar to FIG. 8, albeit illustrating the screen shot at a different time during a customization process.

Referring still to FIG. 8, instances of OR gates may also be added to workspace 141 by selecting OR gate icon 150. The OR gates can be moved around within space 141 to desired locations. Once one or more gates is added to space 141, a system operator can select the connector line icon 151 to be able to add lines to space 141 and connect the gates added by the operator. Thus, for instance, referring to FIG. 9, gate 147 has been added to space 141 and AND gates 149 and 151 have been connected to OR gate 147 via lines while gate 153 is in the process of being connected to OR gate 147 thereby specifying health status rules logic. Referring to FIG. 10, a completed set of logic is illustrated in space 141.

The health status indicators 54 may each be separately selected and moved within space 141 to associate each of the indicators with at least one output of one of the gates within space 141. In at least some embodiments, when a health status indicator is moved to a location adjacent the output of one of the gates in space 141, the indicator will be automatically associated therewith. While all five of the health status indicators described above are shown in space 141, in at least some embodiments less than all of the indicators may need to be added to the logic. In FIG. 10, in addition to the five indicators described above, two additional indicators are provided that are identified collectively by numeral 169. Here, it is contemplated that a system operator may want to specify more than five indicators and the indicators 169 can be used for this purpose. In some embodiments, the labels used for the indicators 154 may be modified by, after adding one of the indicators to space 141, double clicking on the indicator and then typing in a replacement label or the like.

Figure 11:
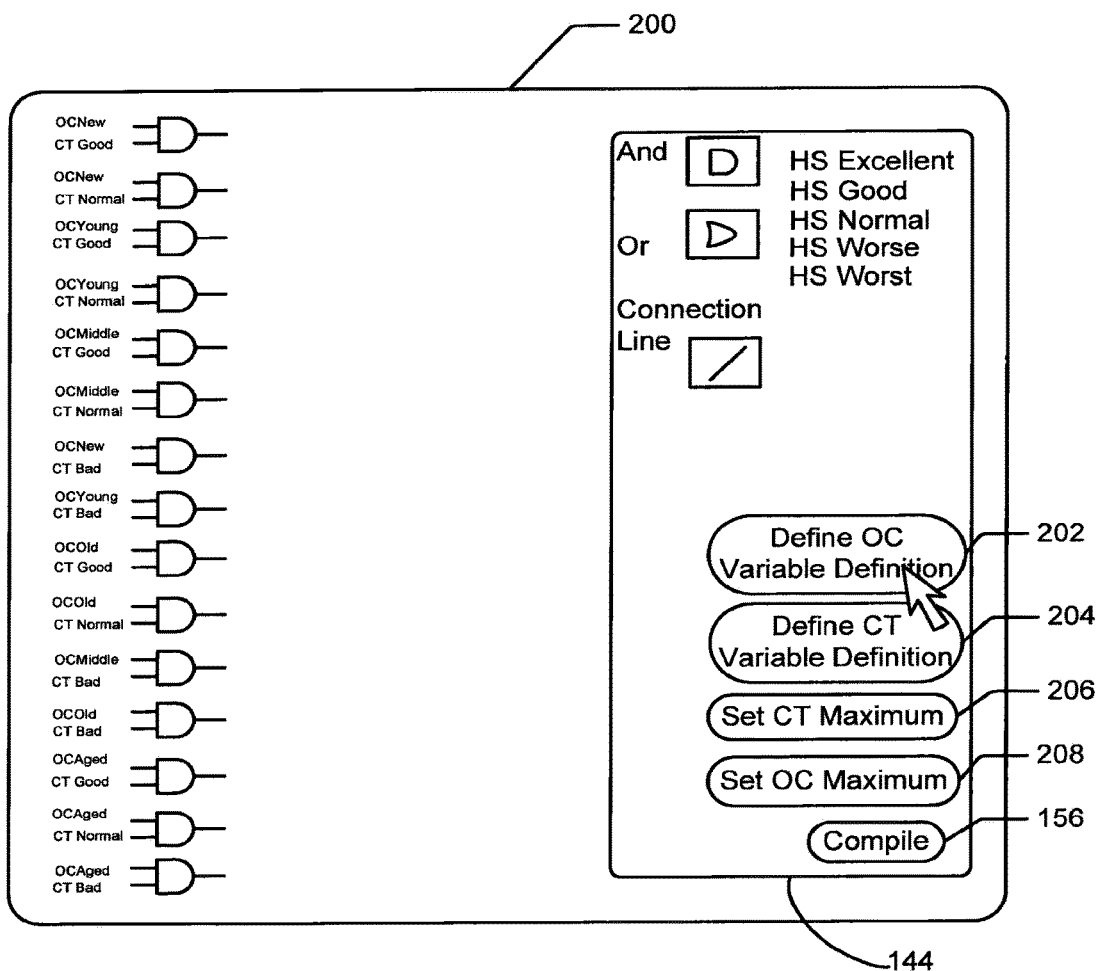
FIG. 11 is similar to FIG. 8, albeit illustrating a different screen shot where a tool bar includes additional tools.
Figure 12:
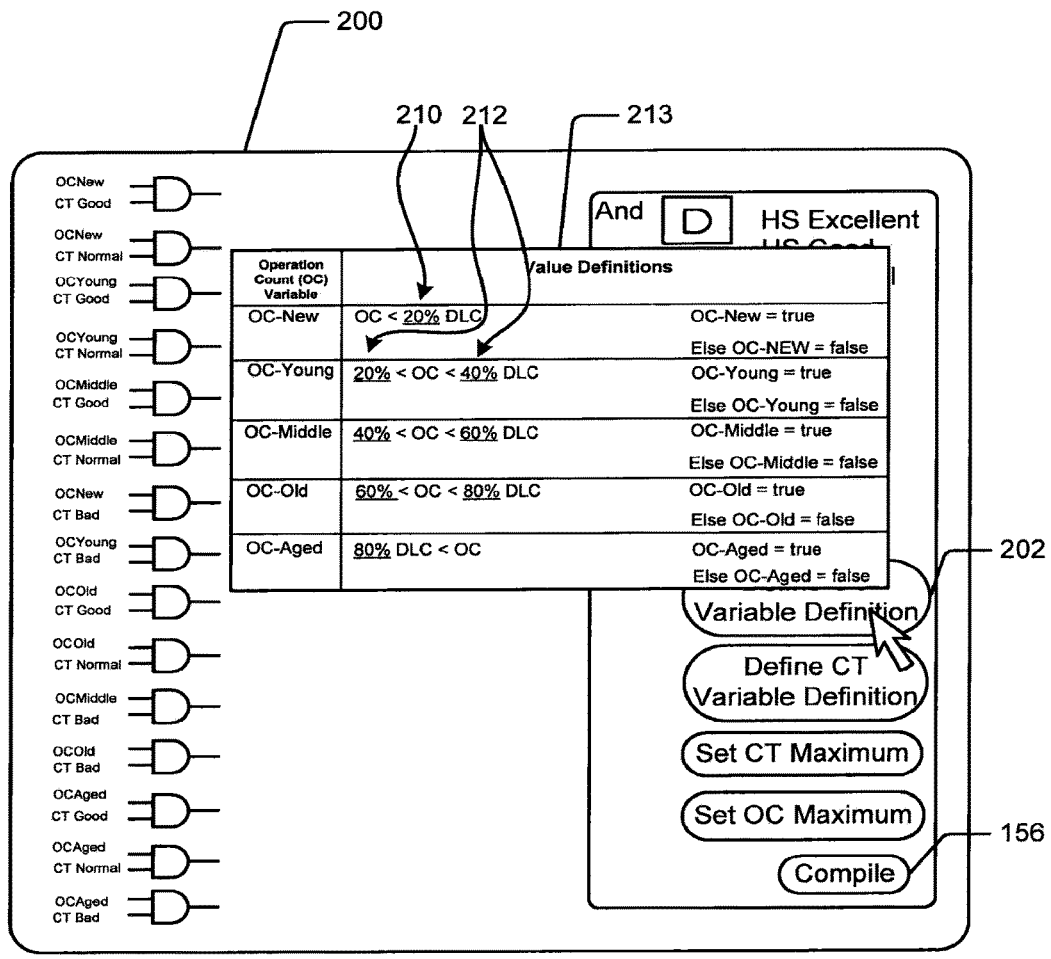
FIG. 12 is similar to FIG. 11, albeit showing a screen shot with an additional sub-window opened for specifying operation count status definitions.

Referring now to FIG. 11, another exemplary screen shot 200 that may be presented via display 22 in FIG. 1 is illustrated where tool bar 144 includes four additional mouse selectable icons including a DEFINE OC VARIABLE DEFINITION icon 202, a DEFINE CT VARIABLE DEFINITION icon 204, a SET MCCT icon 206 and a SET MCC icon 208. In at least some embodiments it is contemplated that when icon 202 is selected, referring to FIG. 12, a sub-window 213 may be opened where a table similar to the table described above with respect to FIG. 3 is presented that includes an operation count variable column and a value definition column. Here, percentages in the value definition column are shown as underlined fields that can be selected so that the values therein can be altered. For example, a field 210 corresponds to the percentage in the definition associated with the OC-New variable while percentage fields are collectively identified by numeral 212 for the definition corresponding to the OC-Young variable. In this case, the system operator may select any one of the percentage fields within window 213 and modify the percentages therein to change the value definition for any one of the operation count variables.

In a similar fashion, operation count variables may be eliminated from the database by simply deleting definitions from the definition column. In some embodiments it is contemplated that other variables may be added to the database using tools similar to conventional table editing tools used in other standard software packages (e.g., via row insertion and entry of new variable names and definition in the field). How sophisticated the database defining tools are is a matter of designer choice and many more sophisticated defining options and tools are contemplated.

Referring again to FIG. 11, similarly, although not illustrated, a system operator may select icon 204 to modify the closing time variable definitions, may select icon 206 to modify the maximum contactor closing time (MCCT) value and may select icon 208 to modify the maximum contactor count (MCC) value used by the health status program. In each of these cases, when one of icons 204, 206 or 208 is selected, a window similar to window 213 described above with respect to FIG. 12 would be opened to enable the operator to modify definitions or maximum values.

Figure 13:
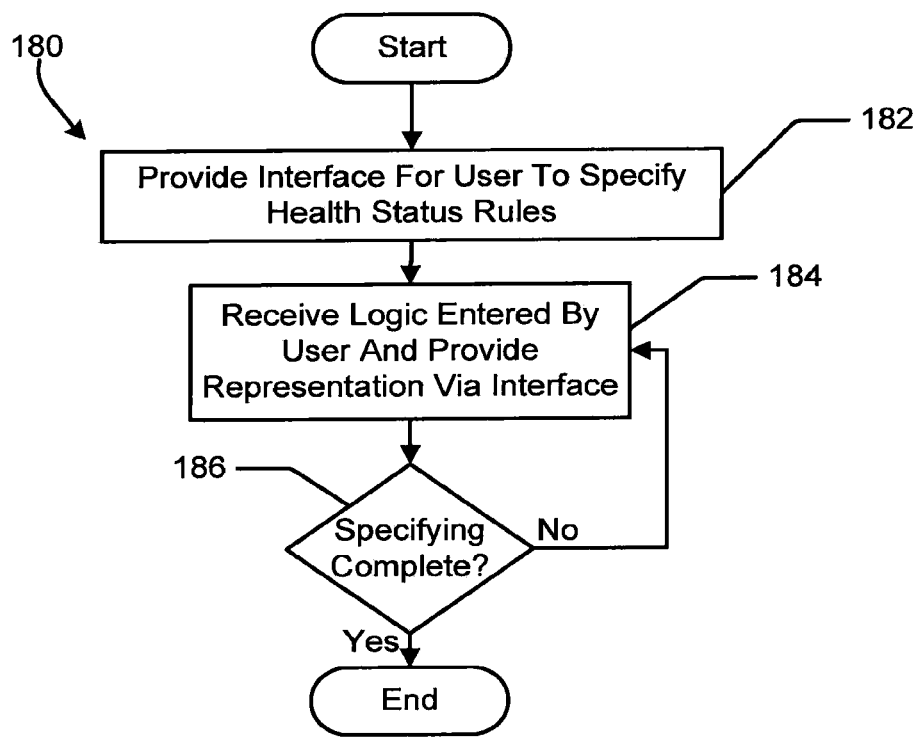
FIG. 13 is a schematic illustrating a customization process that may be performed by the processor of FIG. 1.

Referring now to FIG. 13, a customization program process 180 that may be performed by the processor 26 shown in FIG. 1 is illustrated. At block 182, processor 26 provides an interface for the system operator to specify or customize health status rules. At block 184, the system operator specifies logic via the interface that defines the health status rules. At block 186, processor 26 monitors the interface for a command from the system operator indicating that the rules have been completely specified. To this end, referring again to FIG. 8, after rules have been completely specified, the system operator can select COMPILE icon 156 to cause processor 26 to complete the health status rules specifying process and to store the rules as appropriate. Referring again to FIG. 13, if specifying has not been completed, control passes back up to block 184 where processor 26 continues to receive logic. At block 186, once the specifying process has been completed, the process ends.

In accordance with another aspect of the present disclosure, a method for estimating the contactor life left using contactor usage statistics is contemplated. To this end, the contactor controller includes a power up or on time counter $T_{on}$ that represents the accumulation of power up time of a relay in units of days. Here, the processor 26 of FIG. 1 may be programmed to estimate a contactor life left in units of days of operation by solving the following equation:

$$T_{left(days)} = \frac{MCC - OC}{CPD_{ave}} \qquad \text{Eq. 1}$$

where OC is the current operations count for the contactor and $CPD_{ave}$ is the average operations count per diem for the contactor and is determined by solving the following equation:

$$CPD_{ave} = \frac{OC}{T_{on}} \qquad \text{Eq. 2}$$

The $T_{left}$ value may be reported to a system operator via display 22 routinely or whenever the value $T_{left}$ drops below some threshold value (e.g., 10 days).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

Thus, the invention is to cover all modifications, equivalents, and alternatives falling within the spirit and scope of the invention as defined by the following appended claims. For example, instead of using the most recent contactor closing time to set the closing time variable, processor 26 may be programmed to use a rolling average of closing times over a series (e.g., 20) of contactor operations to set the closing time variable. As another example, a database of contactor maximum closing times and maximum contactor count is contemplated where a system operator may access the database on-line and download maximum values for specific contactor types to be used by the health status software. Here the database could be for contactors manufactured by one company or could include data corresponding to multiple manufacturers. In addition, in some embodiments contactor health may only be determined once within a period (e.g., once every day) or periodically (e.g., every $1200^{th}$ contactor operation). Moreover, other systems are contemplated where operating characteristics other than OC and closing time may be combined in a customizable fashion to assess contactor health. For example, one other operating characteristic that may be monitored includes a contactor open time as well as the proposed close time.

To apprise the public of the scope of this invention, the following claims are made:

We claim:

1. An apparatus for identifying a health status of a contactor, the apparatus comprising:
    a processor, the processor coupled to a non-transitory computer readable medium, the processor to be coupled to the contactor to instruct the contactor to open and close during operation;
    a database stored in the non-transitory computer readable medium, the database including:
    qualitative operation count variables including New, Middle, and Old, each of the qualitative operation count variables correlated to a user defined percentage of the designed life operation value of the contactor, the qualitative operation count variables indicating a relative operation health status of the contactor, and,
    qualitative closing time variables including Good, Normal and Bad, each of the qualitative closing time variables correlated to a user defined percentage of the maximum designed closing time, the closing time variables indicating a relative closing time health status of the contactor, and health status rules of the contactor,
    the qualitative operation count variables and the qualitative closing time variables being inputs to the health status rules to identify the health status of the contactor and being outputs to a display;
    the processor to input at least one of the qualitative closing time variables into a first logical AND gate;
    the processor to input at least one of the qualitative operation count variables into the first logical AND gate;
    the processor to input an output of the first logical AND gate to a logical OR gate;
    the processor to input at least a second output corresponding to a second logical AND gate to the logical OR gate;
    the processor to associate an output of the logical OR gate to the health status of the contactor; and
    a customization program stored in the non-transitory computer readable medium, the customization program enabling an operator to set and to modify on the display at least one of the qualitative operation count variables and the qualitative closing time variables, the customization program further enabling an operator to specify logic on the display, the specified logic defining the health status rules.

2. The apparatus of claim 1 wherein the database further includes an operation count value for the contactor and a closing time value for the contactor.

3. The apparatus of claim 2 wherein the operation count value is a count value indicating the number of times the contactor has been closed and reopened.

4. The apparatus of claim 2 wherein the closing time value is an amount of time required for the contactor to change from an open state to a closed state after a close command has been provided to the contactor from the processor.

5. The apparatus of claim 1 wherein when the contactor health has deteriorated, the processor to provide an indication of the contactor health, the indication to be transmitted via a network to a computer that can present a notice to the operator.

6. The apparatus of claim 5 wherein the indication causes a system associated with the contactor to shut down.

7. The apparatus of claim 1 wherein the database further includes a maximum contactor count value for the contactor and a maximum contactor closing time value for the contactor.

8. The apparatus of claim 1 further including a health status program stored in the non-transitory computer readable medium, the health status program being executed by the processor, the processor applying the health status rules to identify the health status of the contactor.

9. The apparatus of claim 1 wherein the database further includes a health status rules database, the health status rules database including an operation count variable value definition database, a closing time variable value definition database, and a contactor health status variable value definition database.

10. The apparatus of claim 1 wherein at least one of the qualitative operation count variables and the qualitative closing time variables and the health status rules is predefined and is not modifiable.

11. The apparatus of claim 1 wherein the processor uses a rolling average of closing times over a series of contactor operations to set the qualitative closing time variable.

12. The apparatus of claim 1 wherein the customization program includes a logic specifying workspace.

13. A method for identifying a health status of a contactor, the method comprising:
    providing a processor, the processor for coupling to a non-transitory computer readable medium, the processor to be coupled to a contactor for instructing the contactor to open and close during operation;
    providing a database stored in the non-transitory computer readable medium, the database including:
        qualitative operation count variables including New, Middle, and Old, each of the qualitative operation count variables correlated to a user defined percentage of the designed life operation value of the contactor, the qualitative operation count variables indicating a relative operation health status of the contactor, and
        qualitative closing time variables including Good, Normal and Bad, each of the qualitative closing time variables correlated to a user defined percentage of the maximum designed closing time, the closing time variables indicating a relative closing time health status of the contactor, and health status rules of the contactor,
        the qualitative operation count variables and the qualitative closing time variables being inputs to the health status rules for identifying the health status of the contactor and being outputs to a display;
    the processor inputting at least one of the qualitative closing time variables into a first logical AND gate;
    the processor inputting at least one of the qualitative operation count variables into the first logical AND gate;
    the processor inputting an output of the first logical AND gate to a logical OR gate;
    the processor inputting at least a second output corresponding to a second logical AND gate to the logical OR gate;
    the processor associating an output of the logical OR gate to the health status of the contactor; and
    providing a customization program stored in the non-transitory computer readable medium, the customization program enabling an operator to set and to modify on the display at least one of the qualitative operation count variables and the qualitative closing time variables, the customization program further enabling an operator to specify logic on the display, the specified logic defining the health status rules.

14. The method of claim 13 wherein the database further includes an operation count value for the contactor and a closing time value for the contactor.

15. The method of claim 13 wherein the database further includes a maximum contactor count value for the contactor and a maximum contactor closing time value for the contactor.

16. The method of claim 13 further including providing a health status program stored in the non-transitory computer readable medium, the processor executing the health status program, and the processor applying the health status rules for identifying the health status of the contactor.

17. The method of claim 13 wherein when contactor health has deteriorated, the processor providing an indication of the contactor health; and
    transmitting the indication via a network to a computer that can present a notice to the operator.

18. The method of claim 13 wherein the step of enabling an operator to modify the health status rules includes enabling the operator to identify different combinations of the qualitative operation count variables and the qualitative closing time variables that comprise a first health status.

19. The method of claim 13 further including the steps of enabling an operator to modify definitions of at least one of the qualitative operation count variables and the qualitative closing time variables for subsequent use.

* * * * *